United States Patent [19]
Wojciechowski

[11] Patent Number: 5,818,758
[45] Date of Patent: Oct. 6, 1998

[54] ZERO VOLTAGE DROP NEGATIVE SWITCH FOR DUAL WELL PROCESSES

[75] Inventor: Kenneth E. Wojciechowski, Rancho Cordova, Calif.

[73] Assignee: Intel Corporation, Santa Clara, Calif.

[21] Appl. No.: 777,586

[22] Filed: Dec. 31, 1996

[51] Int. Cl.$^6$ .................................................. G11C 16/04
[52] U.S. Cl. .............................. 365/185.18; 365/155.27; 327/536
[58] Field of Search .................... 365/185.18, 185.27; 327/536

[56] References Cited

U.S. PATENT DOCUMENTS

| | | | |
|---|---|---|---|
| 5,093,586 | 3/1992 | Asari | 327/530 |
| 5,126,808 | 6/1992 | Montalvo et al. | 365/185.09 |
| 5,406,524 | 4/1995 | Kawamura et al. | 365/226 |
| 5,553,295 | 9/1996 | Pantelakis et al. | 395/750 |
| 5,612,913 | 3/1997 | Cappelletti et al. | 365/185.12 |
| 5,650,671 | 7/1997 | Pascucci et al. | 307/110 |

*Primary Examiner*—David C. Nelms
*Assistant Examiner*—Hoai V. Ho
*Attorney, Agent, or Firm*—Blakely, Sokoloff, Taylor & Zafman

[57] ABSTRACT

A zero voltage drop switch in a negative switch circuit. The zero voltage drop switch substantially passes the entire negative voltage signal provided by a negative voltage source to the output of the negative switch circuit. The zero voltage drop switch includes a switch circuit coupled to a bootstrapping circuit which augments the voltage passed by the switch circuit. The bootstrapping circuit includes a pair of capacitive devices that receive a pair of non-overlapping clock signals.

26 Claims, 13 Drawing Sheets

ZERO VOLTAGE DROP NEGATIVE SWITCH FOR DUAL WELL PROCESSES

FIELD OF THE INVENTION

The present invention relates to the field of semiconductor integrated circuits, and more particularly to negative switch circuits.

BACKGROUND OF THE INVENTION

Various semiconductor integrated circuits ("ICs") require a negative voltage signal to perform certain operations. For example, flash memory devices may require a negative voltage (e.g., −11 volts) to erase the data stored in the flash memory cells. By maximizing the amount of negative voltage that can be applied to the flash memory cells, the overall performance of the flash memory devices is typically improved. The performance of the flash memory devices may be improved by reducing the amount of time it takes to erase the data stored in the flash memory cells or by reducing the charge loss in the flash memory cells. One method of providing a more negative voltage to the gate of the flash memory cell is to provide a negative switch that is capable of substantially passing the entire negative voltage generated by a negative voltage source (e.g., a negative charge pump). This type of negative switch is often referred to as a zero voltage drop negative switch.

Typically, a negative switch selects between a positive voltage generated by a positive charge pump and a negative voltage generated by a negative charge pump. The positive voltage is outputted from the negative switch via a positive voltage path and the negative voltage is outputted from the negative switch via a negative voltage path. A prior art negative switch 100 is shown in FIG. 1.

According to FIG. 1, the line 140 represents the positive voltage path and the line 150 represents the negative voltage path. The positive voltage path 150 receives a positive voltage signal HHVPX from the positive charge pump 110 and the negative voltage path receives a negative voltage signal HNLVPNX from the negative charge pump 130. The circuit 160 represents the switch used to pass the negative voltage signal generated by the negative charge pump 130 to the output 170 of the negative switch 100. The circuit 160 includes two paths—a quick path having the resistor 120 coupled to the switch 121 and a slow path with the resistor 125.

The quick path may be implemented with a p-channel metal oxide silicon field effect transistor ("MOSFET" or "MOS transistor") coupled in parallel with the resistor 125. The gate terminal of the p-channel MOS transistor may be coupled to another negative charge pump. The prior negative switch 100 may be fabricated using a complementary metal oxide silicon ("CMOS") process in which the p-channel transistors are formed in the n-well and the n-channel transistors are formed in the p-substrate. This CMOS process is often referred to as a dual-well process. Due to process limitations of this dual-well process, it is often difficult to fabricate n-channel transistors that are capable of passing a negative voltage; therefore, typically only p-channel transistors may be used to pass a negative voltage with this CMOS process. Unfortunately, p-channel transistors may not be able to fully pass the negative voltage generated by the negative charge pump 130.

FIG. 2 illustrates a prior art n-channel MOS transistor 200 fabricated with a dual-well CMOS process. The n-channel MOS transistor 200 illustrates that the n-channels 230a and 230b, which represent the source/drain terminals, are formed in the p-substrate 220. Furthermore, the diodes 240a and 240b respectively couple the n-channels 230a and 230b to ground. The polysilicon layer 250 forms the gate terminal of the MOS transistor 200. According to FIG. 2, the input voltage $V_{in}$ is applied to the n-channel 230a via the line 260a; the gate voltage $V_g$ is applied to the gate terminal 250 via the line 260b; and the output voltage $V_{out}$ is received from the n-channel 230b via the line 260c.

The n-channel MOS transistor 200 fabricated with a dual-well process typically can not pass a negative input voltage $V_{in}$. The input of the diodes 240a and 240b are usually coupled to ground and the output of the diodes 240a and 240b may be coupled to the n-channels 230a and 230b respectively. When the voltage at the input is greater than the voltage at the output of the diode 240a (i.e., by the voltage drop across the diodes 240a), then current flows from ground through the diode 240a into the n-channel 230a. When this occurs, the output of pump may be ground out because the negative charge pump is not capable of supplying sufficient current to pass the negative input voltage $V_{in}$ to the output of the MOS transistor 200.

Therefore, when using a dual-well process, n-channel MOS transistors typically can not be used to pass a negative voltage. On the other hand, a p-channel MOS transistor fabricated with a dual-well process typically can pass a negative voltage. Unfortunately, p-channel MOS transistors fabricated with a dual-well process typically do not have the capability of fully passing a negative power supply voltage between its drain and source terminal. In other words, if the negative voltage received at the source terminal of the p-channel MOS transistor (i.e., the input of the negative switch 160), then the p-channel MOS transistor may only pass $V_{in}$-$V_t$ to its drain terminal (i.e., the output of the negative switch 160). The voltage $V_{in}$ represents the voltage at the source terminal of the p-channel transistor and $V_t$ represents the threshold voltage of the p-channel transistor. Thus, when the negative switch 100 selects the negative voltage path 150, the negative voltage generated by the negative charge pump 130 is increased by the voltage drop across the resistor 120. For example, if the negative charge pump 130 generates −11 volts and the voltage drop $V_t$ of the p-channel transistor 200 is 2 volts, then the negative switch 100 outputs −9 volts when the negative path 150 is selected.

Unfortunately, in the prior art, a resistor in parallel with a p-channel MOS transistor does not completely decouple the charge pump 130 from the output 170 of the negative switch. In other words, the circuit 160 does not provide a high enough resistance to prevent the negative voltage path from being a leakage path for the voltage signal at the output 170 of the negative switch when the negative path 150 is not selected. Thus, when there is a positive voltage at the output 170 (e.g., when the positive voltage path is selected), then the negative charge pump 130 may draw current from the node 170 and therefore, consume unnecessary power. This current is referred to as the deselection current.

Because the deselection current increases the power consumption of the negative switch, the overall number of negative switches in a flash memory device is typically limited. Block redundancy is often used to improve the yield of memory of a particular memory IC by allowing bad or defective memory blocks to be replaced with a redundant memory block. The additional (or redundant) memory blocks added to a particular memory IC typically requires additional negative switches. Furthermore, this typically increases the number of negative switches that may be deselected and may cause the overall deselection current to increase. When using the prior negative switch, block redundancy may not be cost effective in terms of power consumption.
}

Although n-channel MOS transistors fabricated with a dual-well process are typically not used to pass a negative voltage, n-channel MOS transistors fabricated with a triple-well process are often used to pass a negative voltage. Thus, the prior art negative switches fabricated with a triple-well process may use an n-channel MOS transistor to pass the negative voltage generated by the negative charge pump to the output of the negative switch.

FIG. 3 illustrates a prior art n-channel MOS transistor 300 fabricated with a triple well process. The triple well process may be referred to as a twin-tub CMOS process because two separate wells (tubs) are typically used to fabricate the n-channel and p-channel transistors in a lightly doped n-type or p-type substrate, respectively. The p-well 340 and the n-well 330 are formed in the p-type substrate 320. Formed within the p-well 340 are the n-channels 350a and 350b which represent the source/drain terminal of the MOS transistor 300. The polysilicon layer 370 forms the gate terminal of the MOS transistor 300. The diodes 340a and 340b formed within the p-well 340 respectively couple the n-channels 350a and 350b to the p-well line 380. A voltage $V_{p\text{-}well}$ is applied to the p-well line 380.

According to FIG. 3, the input voltage $V_{in}$ is applied to the n-channel 350a via the line 360a; the gate voltage $V_g$ is applied to the gate terminal 370 via the line 360b; and the output voltage $V_{out}$ is received from the n-channel 350b via the line 360c. The prior n-channel MOS transistor 300 may fully pass a negative input voltage $V_{in}$ to the output of the n-channel MOS transistor 300 by coupling the p-well line 380 to the line 360a and applying a positive gate voltage $V_g$, such as 5 volts to the n-channel MOS transistor 300. Thus, the prior negative switch 100 implemented in a triple well process may use an n-channel MOS transistor to fully or substantially pass a negative voltage from its input to its output. Unfortunately, many drawbacks exists in changing an existing semiconductor fabrication process from a dual-well process to a triple-well process. For example, it may be extremely costly and time consuming to switch semiconductor processes.

SUMMARY OF THE INVENTION

One desire of the present invention is to substantially pass a negative voltage from the input to the output of a negative switch.

Another desire is to provide a negative switch that substantially reduces the leakage current through the negative path when the negative voltage is deselected.

Another desire is to provide faster switching of the negative voltage.

A negative switch circuit is described that has a first voltage path coupled to the output of the negative switch circuit. The negative switch circuit also includes a second voltage path coupled to the output of the negative switch circuit. The second voltage path includes at least one zero voltage drop switch having a first switch device coupled to a bootstrapping circuit. The bootstrapping circuit includes a first capacitive device and a second capacitive device.

A method is also described for fully passing a first voltage level from an input to an output of a switch circuit. A first non-overlapping low clock signal is received. The first non-overlapping low clock signal has a logic high voltage level or a logic low voltage level. A second non-overlapping low clock signal is received. The second non-overlapping low clock signal has a logic high voltage level or a logic low voltage level. During a first phase of the first and second non-overlapping low clock signals, the first voltage level is provided to a first node and a second voltage level is provided to a second node. The logic high voltage level is greater than the first voltage level by at least the threshold voltage of the switch circuit. The second voltage level is substantially equivalent to the difference between the first voltage level and the logic low voltage level. The first voltage level is outputted during the first phase.

Other desires, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

An embodiment of the present invention provides a zero voltage drop negative switch that may be used in any semiconductor integrated circuit ("IC") requiring a negative voltage. For example, a flash memory device, such as a flash electrically erasable programmable read-only-memory ("EEPROM") device, may require a negative voltage (e.g., −9 volts) to be applied to the gate terminals of the flash cells for programming. On the other hand, during the other operating modes of a flash memory device, a positive voltage may need to be applied to the gates of the flash memory cells. Therefore, a negative switch is used to select between a positive voltage and a negative voltage depending on the operating mode of the flash memory device. For one embodiment, row (or global) negative switches and block negative switches are used to apply the desired voltage level to the gates of the flash memory cells in the main memory array. For alternative embodiments, plane negative switches and various other negative switches may be used to apply either a positive or negative voltage to other parts of the flash memory device.

Figure 1:
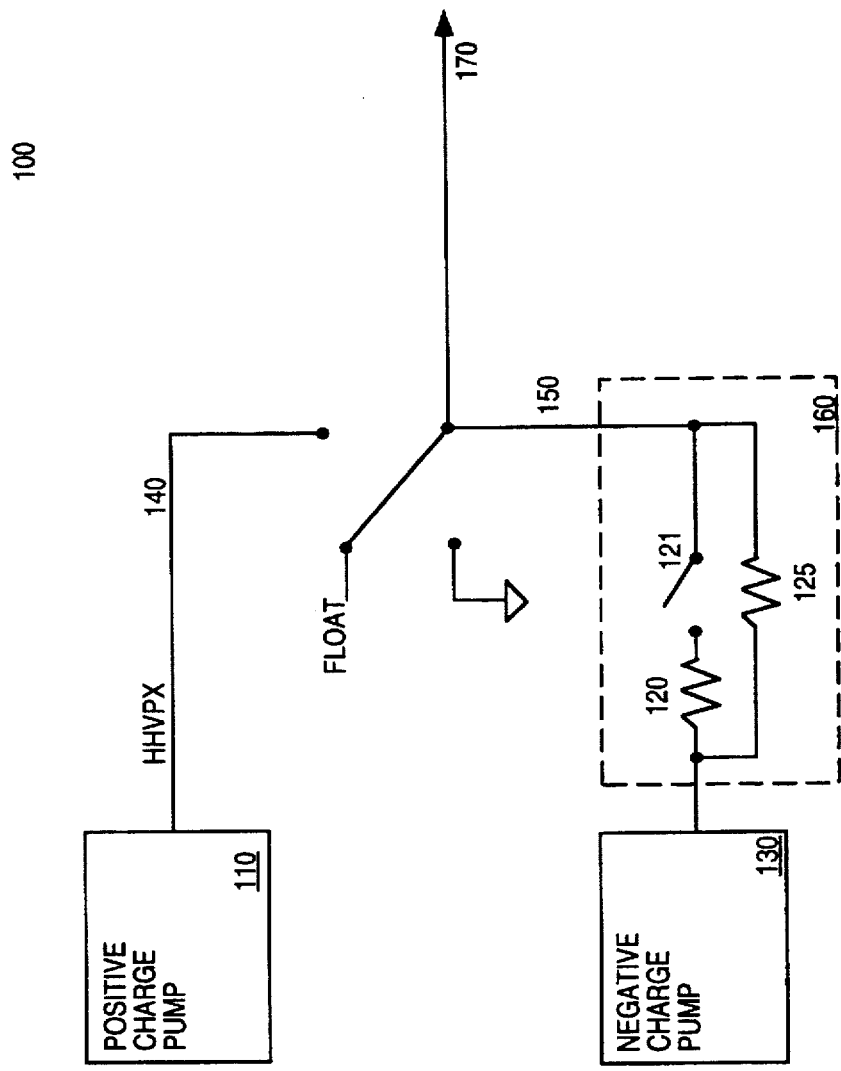
FIG. 1 is an illustration of a prior negative switch.
Figure 2:
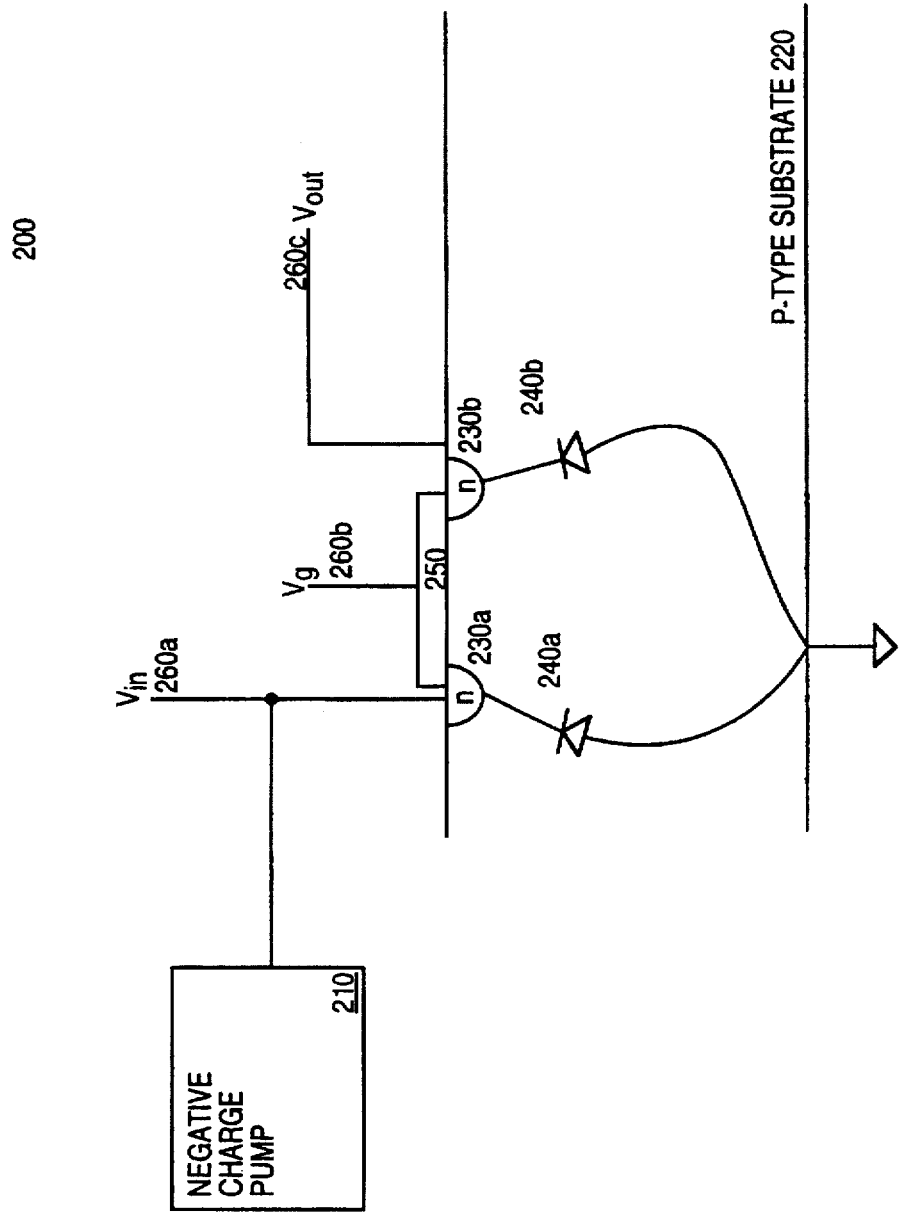
FIG. 2 is an illustration of a cross-sectional view of an n-channel MOS transistor fabricated using a dual-well process.
Figure 3:
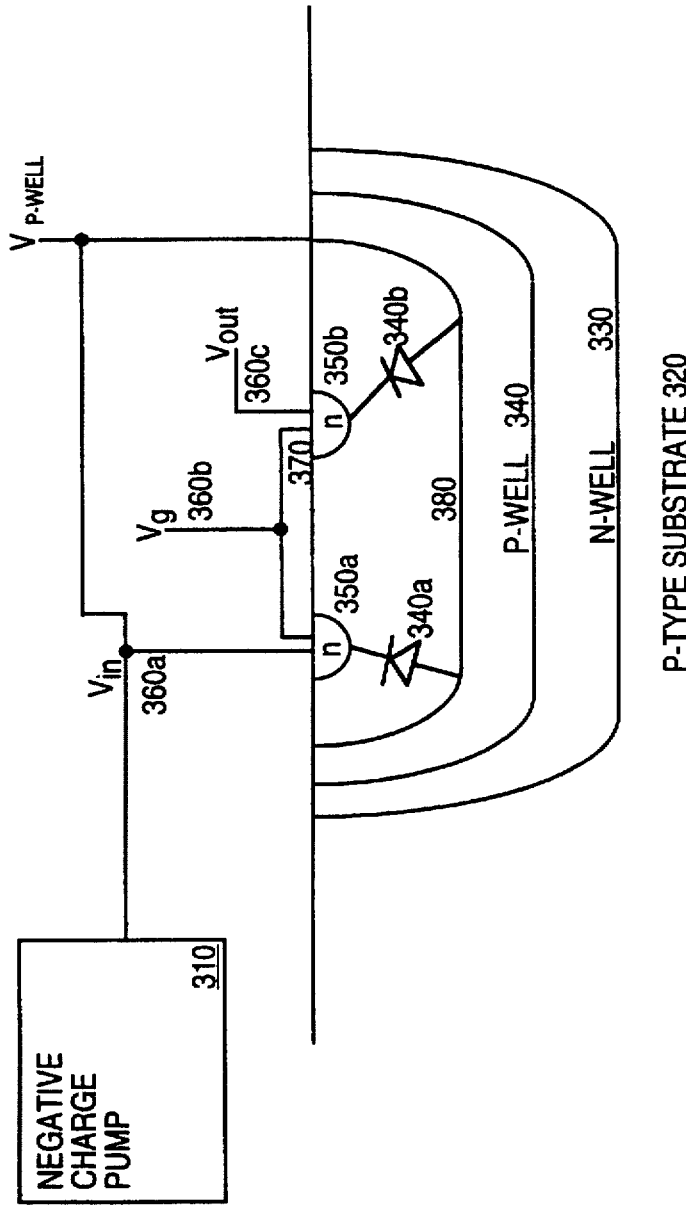
FIG. 3 is an illustration of a cross-sectional view of an n-channel MOS transistor fabricated using a triple-well process.
Figure 4:
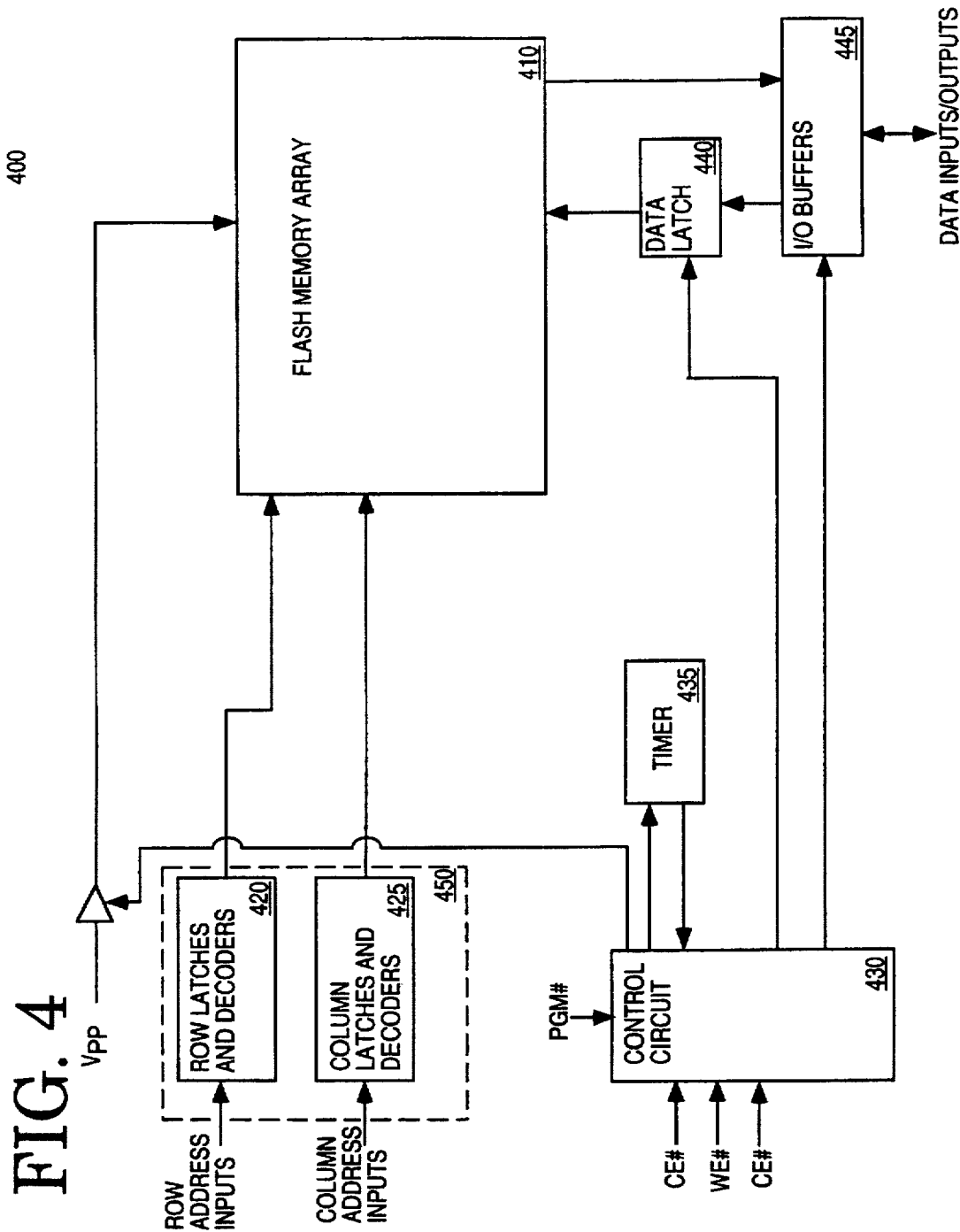
FIG. 4 is an illustration of one embodiment of a memory device that incorporates the negative switch.

FIG. 4 illustrates one embodiment of a block diagram of a flash memory device. The flash memory device 400 may be fabricated using a semiconductor process commonly referred to as a CMOS dual-well process or other semiconductor processes. According to FIG. 4, the flash memory cells within the flash memory array 410 are addressed by the decoding circuit 450, which includes the row latches and decoders 420 and the column latches and decoders 425. The row latches and decoders 420 receives the row address inputs and the row latches and decoders 425 receives the column address inputs. The flash memory device 400 may incorporate one embodiment of the zero voltage drop negative switch circuit in the addressing circuit 450.

The control circuit 430 receives the various control signals, such as a chip enable signal CE#, a write enable signal WE#, an output enable signal OE#, and a program control signal PGM#. The addressing circuit 450, the control circuit 430, and the timer 435 are used to control the reading, writing, and erasing of the flash memory cells.

Data is input and output from the flash memory device 400 via the input/output ("I/O") buffers 445. Input data is latched into the flash memory array 410 via the data latch 440, which is controlled by the control circuit 430.

Figure 5:
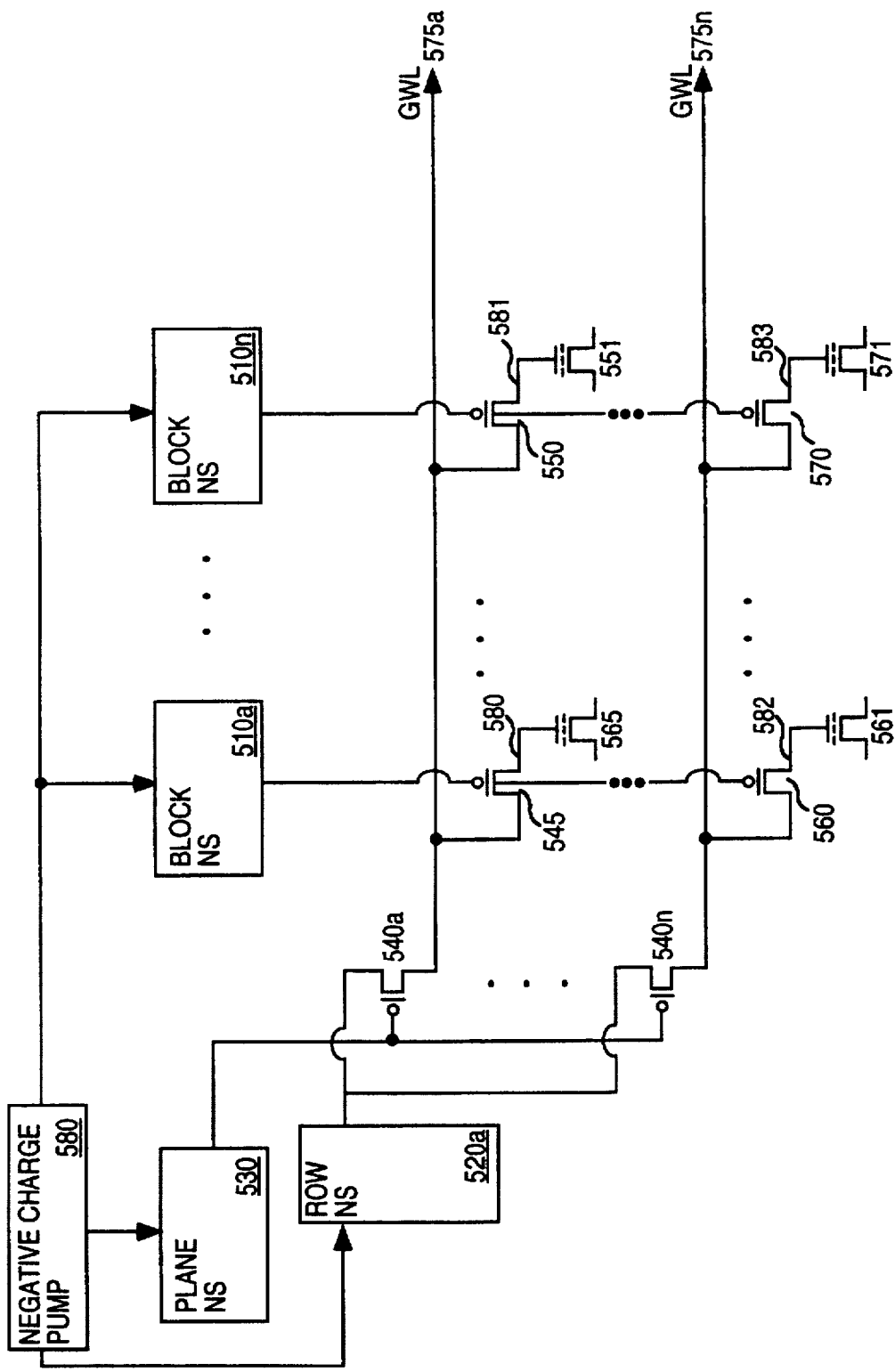
FIG. 5 illustrates one embodiment of the negative switches coupled to a flash memory array.

If the memory array is divided into memory blocks, then the row latches and decoders 420 may also include the block latches and decoders. FIG. 5 illustrates one embodiment that may include multiple zero voltage drop negative switches. The embodiment shown in FIG. 5 may be fabricated using a CMOS dual-well process or other semiconductor processes. According to FIG. 5, the block negative switches 510a through 510n and the row negative switch 520 may all be implemented with one embodiment of the negative switch ("NS"). FIG. 5 also illustrates that if the memory array is divided into multiple planes, then the plane negative switch 530 may also be implemented with one embodiment of the negative switch. For one embodiment, the memory array is divided into four planes with each plane containing 33 one-half blocks. Note that each one-half block may include approximately 1027 rows and therefore, one complete block may include approximately 2054 rows.

The flash memory device 400 can be used in various types of computer systems or data processing systems. The computer system within which the flash memory device 400 is used can be a personal computer, a notebook computer, a laptop computer, a personal assistant/communicator, a minicomputer, a workstation, a mainframe, a multiprocessor computer, or any other type of computer system. In addition, the system in which the flash memory device 400 is used can be a printer system, a cellular phone system, a digital answering system, a digital camera, or any other data storage system.

For one embodiment, all the circuitry of the flash memory device 400 resides on a single semiconductor substrate. For one embodiment, each memory cell of the flash memory array 410 can store one bit of data at a time. For another embodiment, each memory cell of the flash memory array 410 can store multiple bits of data at one time.

A flash memory device may have its row negative switches implemented with one embodiment of the negative switches, and its plane and block negative switches implemented with another embodiment of the negative switches. Furthermore, one embodiment of the negative switches may also be used to provide a negative voltage to various other parts of the flash memory device that require a negative voltage.

For one embodiment of a flash memory device, the row decoders (e.g., the global selects 540a–540n) may be used to select or deselect the global word lines ("GWLs") and the block decoders (e.g., the local selects 530–583) may be used to select or deselect the local word lines ("LWLs"). The global selects 540a through 540n may be used to respectively select or deselect the global word lines 575a through 575n. Furthermore, there may be approximately 2054 global word lines and approximately 2054 global selects. For one embodiment, there may be approximately 33 block negative switches and 33 local selects coupled to each global word line. According to FIG. 5, each global word line may be coupled to multiple local word lines and each local word line may be coupled to at least one flash memory cell. Thus, the global word lines 575a and 575n and the local word lines 580, 550, 560, and 570 may be used to select the flash memory cells 565, 551, 561, and 571 for the various modes of operation (i.e., programming, erasing, and reading).

For one embodiment, the global selects may be p-channel MOS transistors. The gate terminal of the global selects 540a through 540n may be coupled to the plane negative switch 530. The source terminals of the global selects 540a through 540n may be respectively coupled to the row negative switch 520. During an erase operation, the global word line 575a may be selected when the plane negative switch 530 provides a voltage that is approximately the same voltage as the voltage provided by the row negative switch 520 (e.g., −11 volts). Otherwise, the global word line 575a may be deselected. Similarly, the global word line 575b may be selected during an erase operation when the plane negative switch 530 provides a voltage that is approximately the same voltage as the voltage provided by the row negative switch 520 (e.g., −11 volts). Otherwise, the global word line 575b may be deselected. For one embodiment, −11 volts may be applied to both the gate and source terminals of the global selects (e.g., 521–520n) in order to pass −9 volts onto a corresponding global word line 575a–575n. Thus, a selected global word line may be at −9 volts.

According to FIG. 5, the local select 545 may be used to select or deselect the local word line 580; the local select 550 may be used to select or deselect the local word line 581; the local select 560 may be used to select or deselect the local word line 582; and the local select 570 may be used to select or deselect the local word line 583. For one embodiment, the local selects 545, 550, 560, and 570 may be p-channel MOS transistors.

The local word line 580 may be selected when the voltage provided by the block negative switch 510a is more negative than the voltage on the global word line 575a by at least the threshold voltage $V_t$ of the local select 545. Similarly, the local word line 581 may be selected when the voltage provided by the block negative switch 510n is more negative than the voltage on the global word line 575a by at least the threshold voltage $V_t$ of the local select 550. The local word lines 582 and 583 may be selected in a similar manner and will not be discussed in further detail here.

For one embodiment, the flash memory cells selected for an erase operation requires approximately −9 volts to be applied to their gate terminals while their drain terminals are left floating and approximately 6–7 volts is applied to their source terminals. Thus, during an erase operation, the plane negative switch 530 provides −11 volts to the gate terminal of the global select 540a–540n; the selected row negative switch provides −11 volts to the source terminal of its corresponding global select; and the selected block negative switch provides −11 volts to the gate of its corresponding local select.

As previously discussed, when fabricating the flash memory device with a dual-well process, the p-channel MOS transistors typically can not fully pass a negative voltage. Thus, the global selects may pass a negative voltage which is equal to the negative voltage provided by its corresponding row negative switch plus the threshold voltage $V_t$ of the global select. In other words, there is a voltage drop across the global selects which is equivalent to the threshold voltage $V_t$ of the global select. For example, if the global select 540a is selected by the plane negative switch 530 and the row negative switch 520a, then the global select 540a will attempt to pass the −11 volts provided by the row negative switch 520a. If the threshold voltage $V_t$ of the global select 540a is 2 volts, then the global select 540a will only pass −9 volts to the global word line 575a.

If the flash memory cell 565 is included in the block of memory cells selected for an erase operation, then −11 volts may be applied to the gate terminal of the local select 545 and −9 volts may be applied to the source terminal of the local select 545 via the global word line 575a. If the threshold voltage $V_t$ of the local select 545 is less than 2 volts, then at least −9 volts may pass to the gate terminal of the flash memory cell 565.

For one embodiment, the negative charge pump 580 may operate as the negative voltage power supply for the plane negative switch 530, the block negative switches 510a–510n, and the row negative switches 520a–520n. By substantially eliminating the voltage drop across the various negative switches shown in FIG. 5, the negative voltage provided to the gates of the selected flash memory cells may be maximized. Typically, the rate of electrons tunneling off the floating gate of a flash memory cell during an erase operation increases as the voltage applied to the gate terminal of the flash memory cell is made more negative. Thus, the amount of time it takes to erase the flash memory cells may be reduced.

For an alternative embodiment, the negative switch may be used to select or deselect to the global word lines in a reference cell sub-array referred to as the reference cell array, or may be used to select or deselect the local word lines in a sub-array referred to as the block lock array. Furthermore, one embodiment of the negative switch may be used to provide a negative voltage to other memory cells or memory arrays in a semiconductor IC.

Figure 6:
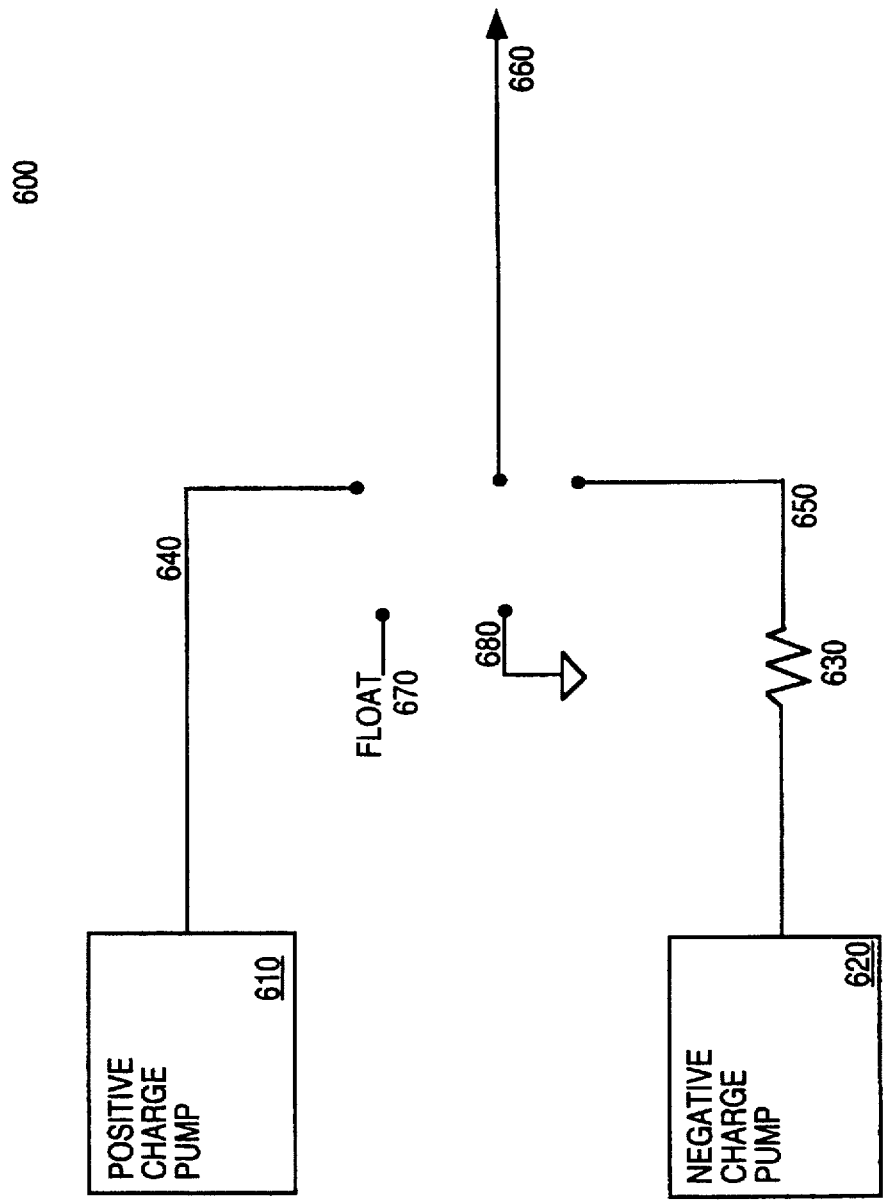
FIG. 6 illustrates one embodiment of a negative switch.

FIG. 6 illustrates in block diagram form one embodiment of the negative switch 600. The present negative switch 600 may be implemented using a CMOS dual-well process or other semiconductor processes. The negative switch 600 may select between a positive voltage from a positive voltage path 640 and a negative voltage from a negative voltage path 650. Thus, when the positive voltage path 640 is selected, the negative switch 600 provides a positive voltage signal at the output 660 and when the negative voltage path 650 is selected, the negative switch 600 provides a negative voltage signal at the output 660. According to FIG. 6, the positive charge pump 610 generates the positive voltage signal and the negative charge pump 620 generates the negative voltage signal. In addition to selecting a positive or negative voltage signal, the negative switch 600 may float the output 660 by selecting the float terminal 670 or ground the output 660 by selecting the ground terminal 680.

If the output 660 of the negative switch 600 is not substantially decoupled (i.e., by providing a sufficiently large resistance) from the negative charge pump 620 when the negative voltage path 650 is not selected (i.e., when output 660 is supplying a positive voltage or 0 volts), current may leak from the output 660 over the negative voltage path 630 to the negative charge pump 620. This leakage current is often referred to as the deselection current. The deselection current may increase the power consumption of the negative switch.

One advantage of the negative switch 600 is that the switch 630 may provide approximately one-million times greater resistance than the circuit 160 in the prior art negative switch 100. The switch 630 is shown as a resistor in FIG. 6. As a result, the deselection current in one embodiment of the negative switch 600 may be approximately one-million times lower than the deselection current in the prior negative switch 100. In other words, the negative voltage path 650 may be substantially decoupled from the output 660 of the negative switch 600 when the negative voltage signal is not selected. It is important to note that the circuit 160 in the prior art negative switch 100 typically did not substantially decouple the negative voltage path 650 from the output 660 when the negative voltage signal was deselected. This low deselection current in one embodiment may reduce the power consumption of the negative switch and may allow for lower power designs. This may lead to the design of memory devices with a greater number of erasable memory blocks than would be possible with the prior art negative switch 100.

The high resistance provided by the negative switch 630 when the negative voltage path 650 is deselected may make block redundancy cost effective in terms of power consumption. It is important to note that the prior art memory devices that incorporated the prior art negative switch 100 typically did not include the feature of block redundancy. If the block redundancy feature was incorporated into the prior art memory devices, the power consumption of the prior art memory devices may be increased by approximately 2.5 times. By using one embodiment of the negative switch 600, the overall power consumption of the memory device, which includes the block redundancy feature, may not increase the power consumption over the prior art memory device.

In addition to substantially increasing the resistance of the negative voltage path 650 when the negative voltage path is selected, the resistor 630 may be approximately one-thousand times smaller than the resistance provided by the prior art circuit 160 when selected. This allows the negative switch 600 to switch to the negative voltage path faster than the prior art negative switch 100. In other words, the negative switch 600 may output a negative voltage faster than the negative switch 100.

Figure 7:
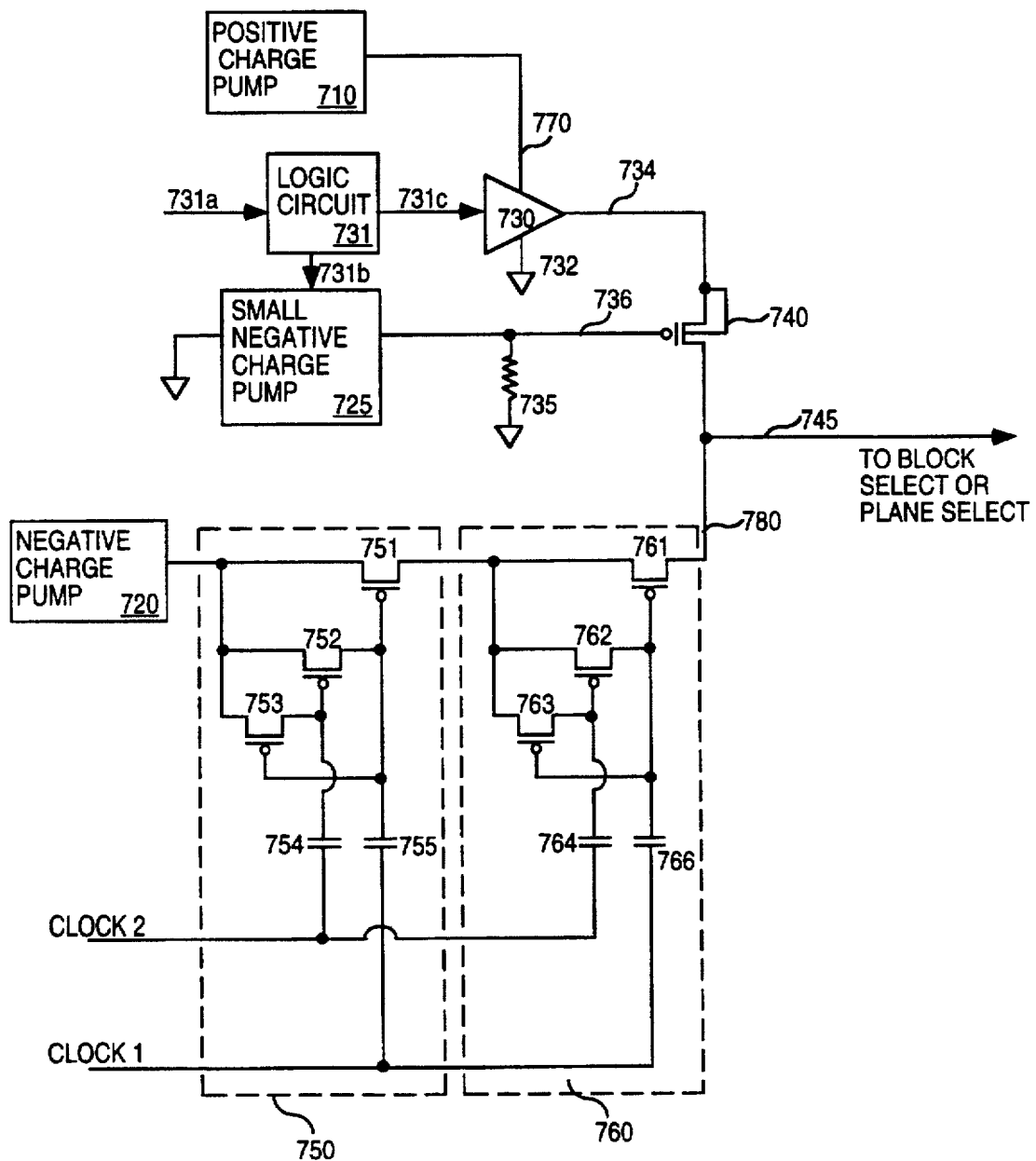
FIG. 7 illustrates one embodiment of the zero voltage drop switch in a negative switch.

FIG. 7 illustrates one embodiment of the negative switch 700. The present negative switch 700 may be implemented using a dual-well process or other semiconductor processes. For one embodiment, the block negative switches 510a–510n and the plane negative switch 530 may be implemented with the negative switch 700. According to FIG. 7, the positive charge pump 710 generates the positive voltage signal and the negative charge pump 720 generates the negative voltage signal. The positive voltage signal is provided to the output 745 of the negative switch 700 over the positive voltage path 770. The positive voltage path 770 may also be used to couple the output 745 to ground.

The negative voltage signal is provided to the output 745 via the negative voltage path 780. The negative voltage path 780 and the positive voltage path 770 may also be used to float the output 745 when both paths are deselected. For one embodiment, the output 745 may float when the output 745 is less than or equal to 0 volts. Typically, the output 745 is left floating when the clock input signals clock 1 and clock 2 are not provided. Furthermore, the output 745 of the negative switch 700 may be coupled to ground.

According to FIG. 7, the positive voltage path 770 is coupled to the positive charge pump 710. The positive voltage path includes the driver 730 and the p-channel MOS transistor 740. The logic circuit 731 controls the voltage at the node 734. The logic circuit 731 receives an input control signal over line 731a and provides output signals over lines 731b and 731c.

For one embodiment, the negative switch 700 may output 0 volts when the logic circuit 731 provides a low logic level voltage signal (e.g., 0 volts) and the small negative pump 725 is turned on. Once the small negative pump 725 provides sufficient negative voltage to the gate of the transistor 740, the transistor 740 turns on and the negative switch 700 outputs 0 volts. On the other hand, the negative switch 700 may output a positive voltage (or a voltage greater than the threshold voltage $V_t$ of the transistor 740) when the small negative charge pump 725 is off and approximately 0 volts is applied to the gate terminal of the transistor 740. In this situation, the voltage provided by positive charge pump 710 is outputted by the negative switch 700.

The negative voltage path 780 may include the zero voltage drop switches 750 and 760. For one embodiment the zero voltage drop switches 750 and 760 may be identical. Although the negative voltage path 780 may include two zero voltage drop switches, alternative embodiments may use a single zero voltage drop switch or may use more than three zero voltage drop switches. For one embodiment, the zero voltage drop switches 750 and 760 substantially pass the entire negative voltage signal generated by the negative charge pump 720, provided that the clock 1 signal and the clock 2 signal are non-overlapping low signals. The non-overlapping low signals will be described in further detail in conjunction with FIG. 13.

The zero voltage drop switch 750 includes the p-channel MOS transistors 751, 752, and 753, and the capacitors 754 and 755. The transistor 751, referred to as the switch circuit, is coupled between the input and the output of the zero voltage drop switch 750. The gate of the transistor 751 is coupled to a bootstrapping circuit that enables the transistor 751 to substantially pass the entire negative voltage signal from its input to its output. Typically, a bootstrapping circuit is a circuit that augments the power supply to fully pass the power supply voltage. This may be accomplished with the use of capacitors.

For one embodiment, the bootstrapping circuit may include the transistors 752 and 753, and the capacitors 754 and 755. The transistor 752 is coupled between the gate terminal of the transistor 751 and the input of the zero voltage drop switch 750. The transistor 753 is coupled between the gate of the transistor 752 and the input of the zero voltage drop switch 750. The gate of the transistor 752 is coupled to the clock 1 signal via the capacitor 754. The gates of the transistors 751 and 753 are coupled to the clock 2 signal via the capacitor 755.

The output of the zero voltage drop switch 750 may be coupled to the input of the zero voltage drop switch 760. The output of the zero voltage drop switch 760 may be directly coupled to the output 745 of the negative switch 700. The zero voltage drop switch 760 may include the p-channel MOS transistors 761, 762, and 763 and the capacitors 764 and 765. The transistor 761 is referred to as the switch circuit because it determines whether the voltage at the input of the zero voltage drop switch 760 passes to its output. The transistor 762 is coupled between the gate terminal of the transistor 761 and the input of the zero voltage drop switch 760. The gate of the transistor 761 is coupled to a bootstrapping circuit that may enable the transistor 761 to fully pass a negative voltage signal from its input to its output.

For one embodiment, the bootstrapping circuit may include the transistors 762 and 763 and the capacitors 764 and 765. The transistor 763 is coupled between the gate of the transistor 762 and the input of the zero voltage drop switch 760. The gate of the transistor 762 is coupled to the clock 1 signal via the capacitor 764. The gates of the transistors 761 and 763 are coupled to the clock 2 signal via the capacitor 765.

For one embodiment of the zero voltage drop switches 750 and 760, the stress between the inputs and the output of each zero voltage drop switches may be limited to 12 volts. In other words, the voltage potential between the input and the output of the p-channel transistor operating as the switch circuit (e.g., 751 and 761) may not exceed 12 volts. Typically, the amount of stress is limited by the type of semiconductor process. For one embodiment, the zero voltage drop switches 750 and 760 may be fabricated with a dual-well process having a stress limit of 12 volts. This type of stress may be an issue during a programming operation when the block negative switches corresponding to the deselected blocks receive a negative voltage such as −3 volts from the negative charge pump and outputs a positive voltage such as 12 volts.

Figure 8:
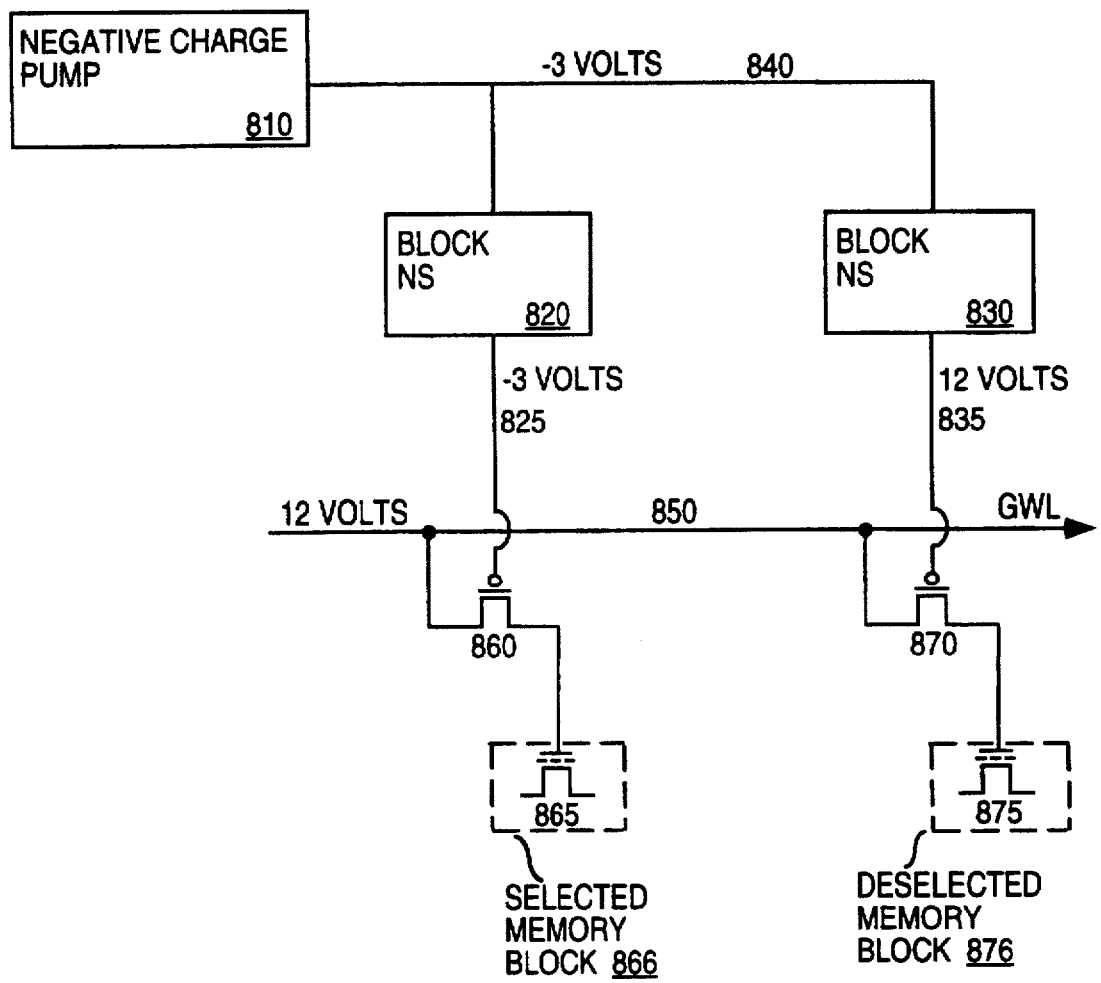
FIG. 8 illustrates one embodiment of the block negative switches during a programming operation.

FIG. 8 illustrates that during a programming operation, the stress between the input and output of a block negative switch may exceed its maximum stress limits (e.g., 12 volts). During a programming operation of a flash memory device, the negative charge pump 810 may provide −3 volts to the negative voltage path in both the block negative switch 820 and the block negative switch 830. The block negative switch 820 may correspond to a selected memory block 866 and therefore may provide −3 volts to the local select 860 to enable the local select 860 to pass the 12 volts on the global word line to the flash memory cells (e.g., 865) within the selected memory block 866.

On the other hand, the block negative switch 830 may correspond to a deselected memory block 876 and therefore may provide 12 volts to the local select 870 to deselect it. Thus, the 12 volts on the global word lines may not pass to the flash memory cells (e.g., 875) within the deselected memory block 876. Apparently, when −3 volts is applied to the input of the negative voltage path within the block negative switch 830 and the block negative switch 830 outputs 12 volts, the 12 volts stress limit may be exceeded.

In order to stay within the required stress limits, two zero voltage drop negative switches may be coupled together. Thus, the stress across the zero voltage drop switch 750 may be approximately 12 volts and the stress across the zero voltage drop switch 760 may be approximately 3 volts.

Figure 9:
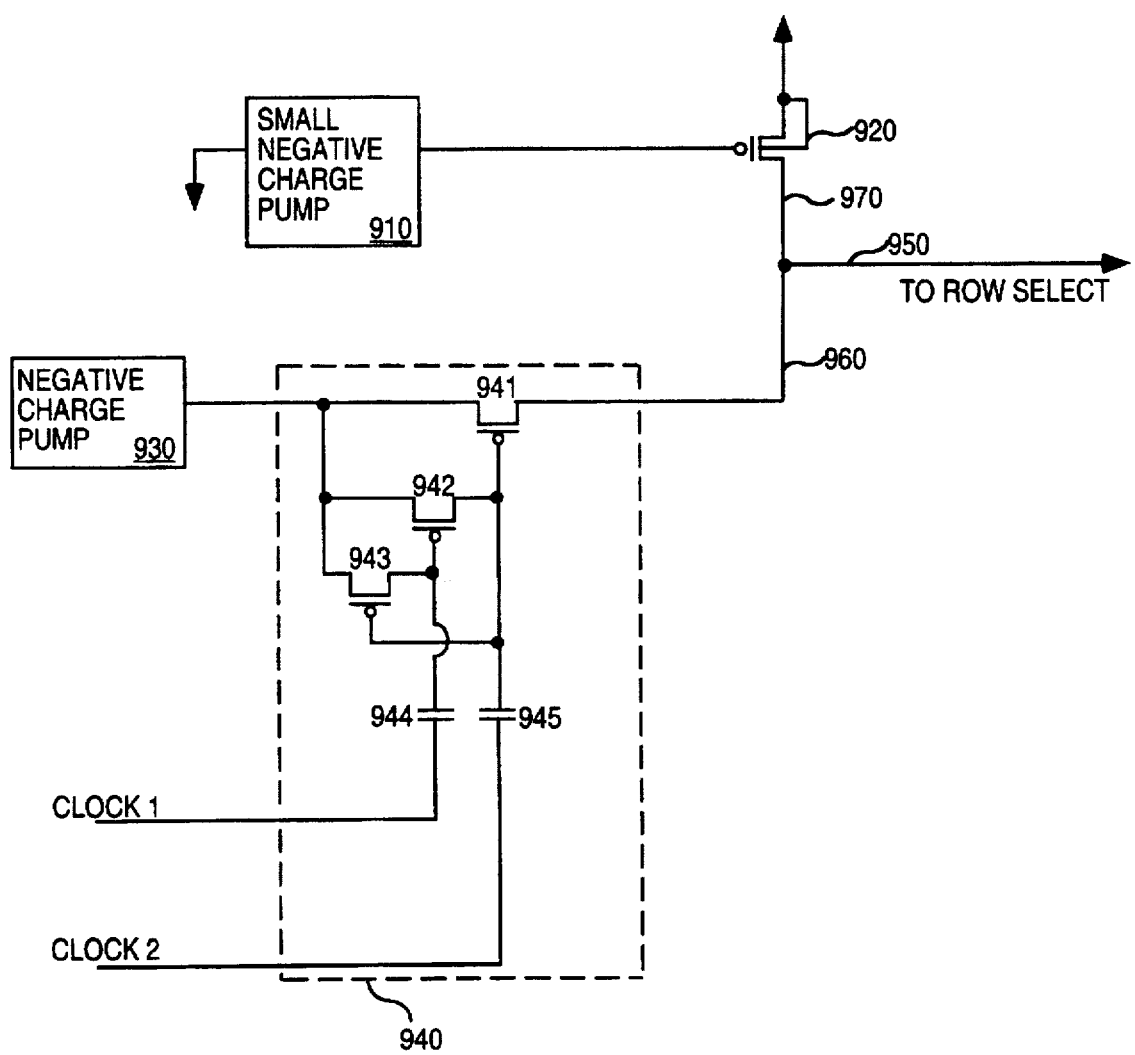
FIG. 9 illustrates an alternative embodiment of the zero voltage drop switch in a negative switch.

FIG. 9 illustrates another embodiment of the negative switch 900. The present negative switch 900 may be implemented using a CMOS dual-well process or other semiconductor processes. For one embodiment, the row negative switches 520a–520n may be implemented with the negative switch 900. Because the zero voltage drop switch 940 typically does not exceed the 12 volt stress limit, a single zero voltage drop switch 940 may suffice. The zero voltage drop switch 940 may include the p-channel MOS transistor 941, referred to as the switch circuit, coupled between the input and output of the zero voltage drop switch 940. The gate of the p-channel MOS transistor 941 is coupled to a bootstrapping circuit. The bootstrapping circuit may include the p-channel MOS transistors 942 and 943 and the capacitors 944 and 945. The two non-overlapping low clock input signals clock 1 and clock 2 are respectively received by the capacitors 944 and 945.

For one embodiment, the negative switch 900 may provide a voltage signal between 0 volts and −11 volts at its output 950 or leave its output floating. Thus, when the negative voltage path 960 is selected, the negative voltage provided by the negative charge pump 930 may be fully passed to the output 950, provided the input clock signals clock 1 and clock 2 are provided. If the negative voltage path 960 is selected but the input clock signals clock 1 and clock 2 are not provided, then the output 950 may be left floating. On the other hand, when the positive voltage path 970 is selected, the output 950 may be coupled to ground via the p-channel MOS transistor 920. The small negative charge pump 910 controls the voltage on the positive voltage path.

Figure 10:
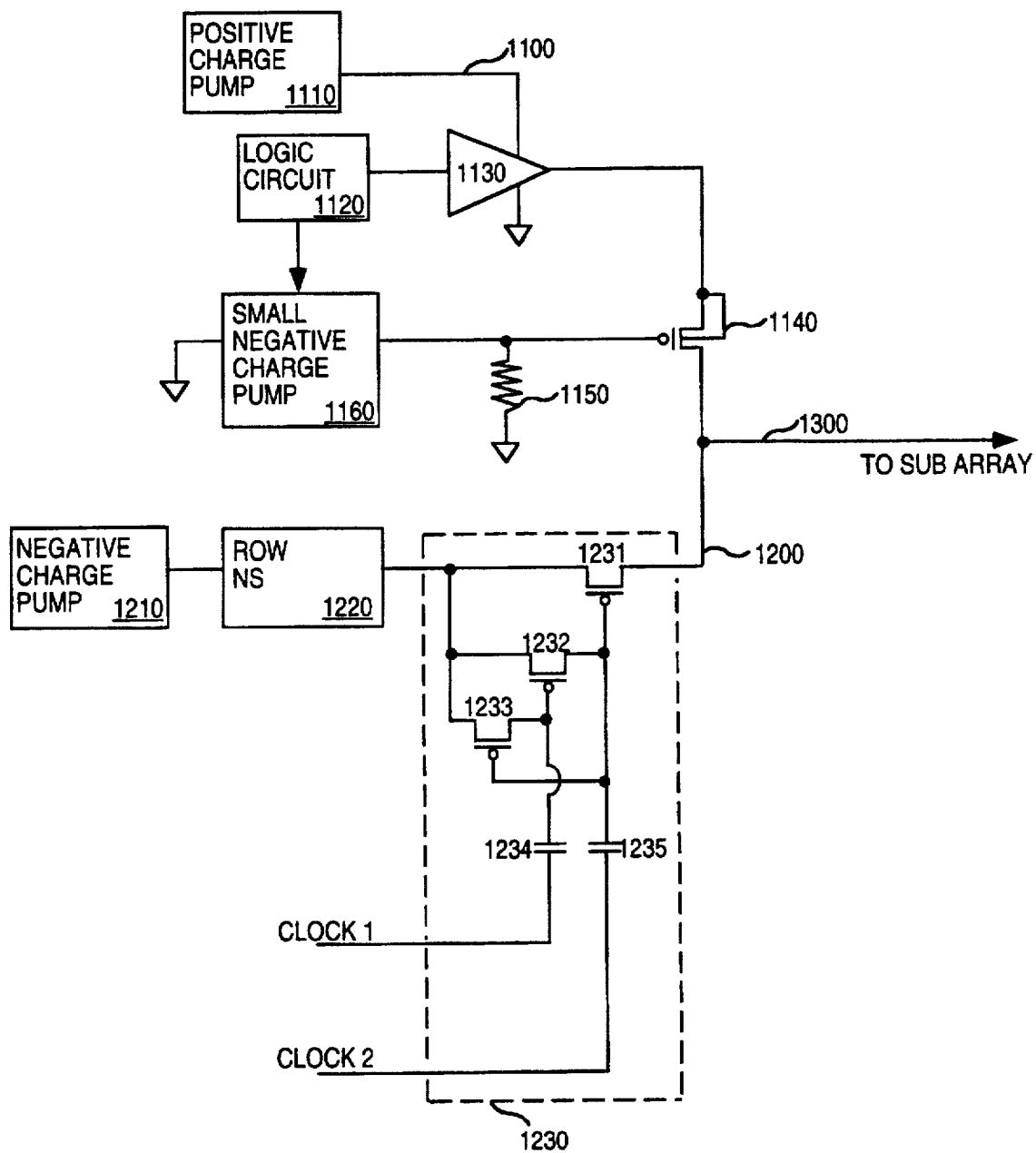
FIG. 10 illustrates another embodiment of the zero voltage drop switch in a negative switch.

FIG. 10 illustrates another alternative embodiment of the negative switch 1000. The present negative switch 1000 may be implemented using a CMOS dual-well process or other semiconductor processes. The present negative switch 1000 may be implemented in the negative switch that is coupled to a sub-array of flash memory cells. The sub-array may represent a group of reference cells.

The positive voltage path 1100 may include the positive charge pump 1110, the logic circuit 1120, the driver 1130, the p-channel MOS transistor 1140, the small negative charge pump 1160, and the resistor 1150. The positive voltage path 1100 may operate in a similar manner to the voltage path 770 and therefore will not be discussed in further detail here.

The negative voltage path 1200 may be coupled to the row negative switch 1220, which is coupled to the negative charge pump 1210. The negative voltage path 1200 may include one zero voltage drop switch 1230. The zero voltage drop switch 1230 may include the p-channel MOS transistor 1231 coupled between the input and its output of the zero voltage drop switch 1230. The transistor 1231 may be referred to as a switch circuit. The gate of the MOS transistor 1231 is coupled to a bootstrapping circuit in order to fully or substantially pass the negative voltage signal provided by the row negative switch 1220. The bootstrapping circuit may include the p-channel MOS transistors 1232 and 1233 and the capacitors 1234 and 1235. The zero voltage drop switch 1230 may not require more than one zero voltage drop switch because the zero voltage drop switch 1230 typically operates within the maximum stress limits.

For one embodiment, the row negative switch 1220 may output 5 volts. However, during an erase operation, the row negative switch 1220 may output −11 volts. If the erase operation is used to erase the flash memory cells in the main memory array (e.g., 410), then the negative switch 1000 may output 0 volts. On the other hand, if the erase operation is used to erase the flash memory cells in a sub-array (e.g., the reference cells), then the negative switch 1000 may output −11 volts. Because the maximum stress imposed on the zero voltage drop switch 1230 may be less than 12 volts, a single zero voltage drop switch 1230 may suffice.

Figure 11:
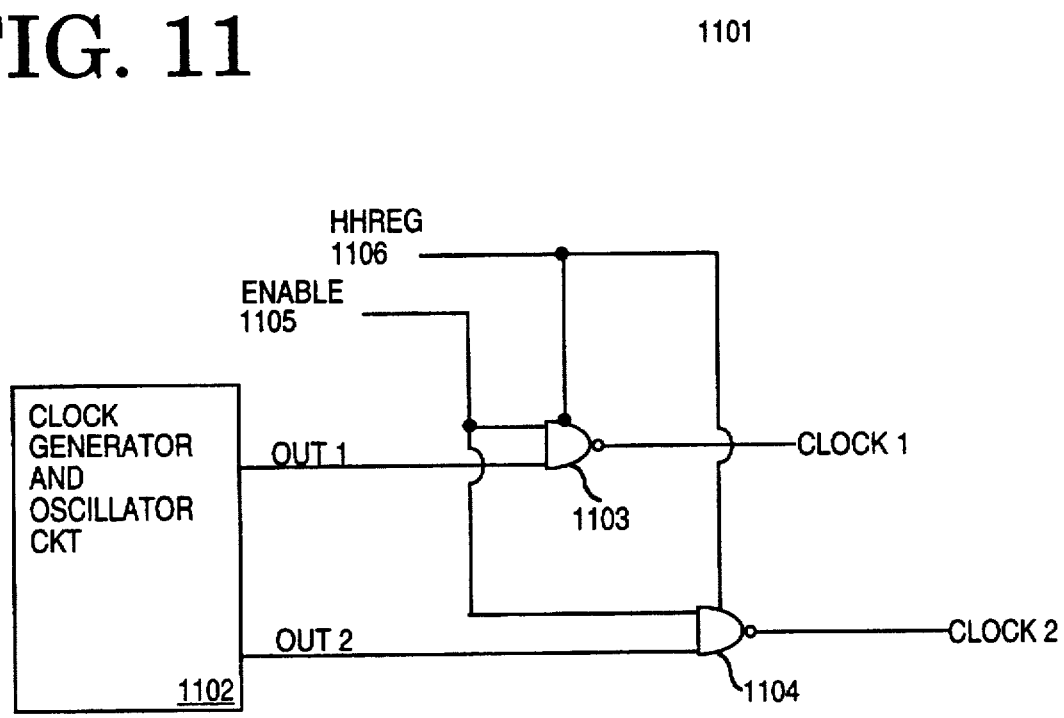
FIG. 11 illustrates one embodiment of the clock 1 and clock 2 generating circuits.

FIG. 11 illustrates one embodiment of a circuit that generates the clock input signals clock 1 and clock 2. The clock input signals clock 1 and clock 2 are non-overlapping clock signals. The clock generator and oscillator circuit 1102 generates two clock signals out 1 and out 2. For one embodiment two clock signals may be non-overlapping low clock signals.

The clock signals out 1 and out 2 may provide inputs into the NAND gates 1103 and 1104. The enable signal 1105 may also provide input signals into the NAND gates 1103 and 1104. When the enable signal 1105 is asserted, then the clock signals out 1 and out 2 provide the two non-overlapping low clock input signals clock 1 and clock 2. On the other hand, when the enable signal 1105 is deasserted, then the clock input signals clock 1 and clock 2 are not provided to the negative switch and the output of the negative switch is left floating. The HHREG signal 1106 may control the amplitude of the non-overlapping low clock input signals clock 1 and clock 2.

Figure 12:
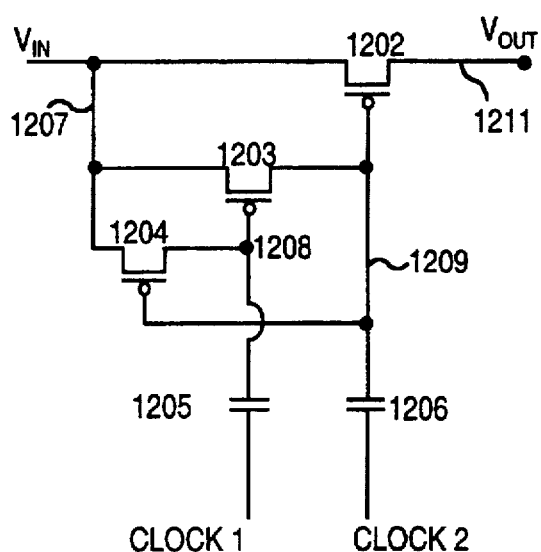
FIG. 12 illustrates one embodiment of the zero voltage drop switch.
Figure 13:
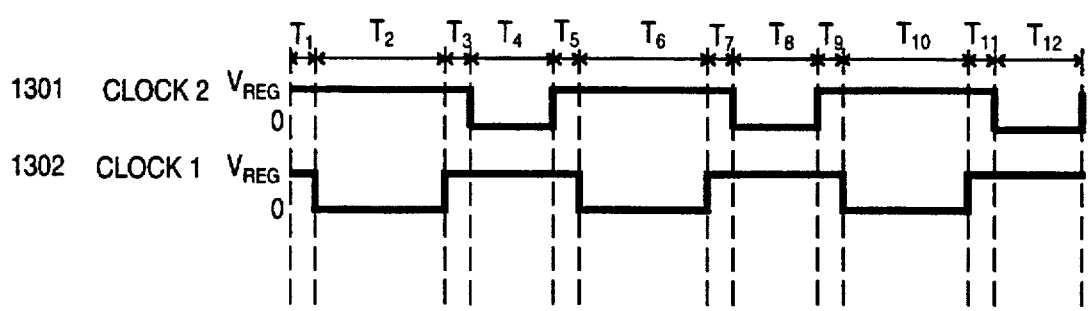
FIG. 13 illustrates the voltage waveforms for one embodiment of the zero voltage drop switch.

The clocking scheme of the two non-overlapping low input clock signals clock 1 and clock 2 is illustrated in FIG. 13. The zero voltage drop switch 1201 shown in FIG. 12 is described in conjunction with the non-overlapping clocking scheme shown in FIG. 13. The zero voltage drop switch 1201 may be fabricated with a CMOS dual-well process or other semiconductor processes. The waveform 1301 represents the input clock signal clock 2 and the waveform 1302 represents the input clock signal 1.

The zero voltage drop switch 1201 may include the p-channel MOS transistors 1202, 1203, and 1204, and the capacitors 1205 and 1206. The transistor 1202, referred to as the switch circuit, is coupled between the input and the output of the zero voltage drop switch 1201. The transistor 1202 is typically larger in size than the transistors 1203 and 1204. The transistors 1202, 1203, and 1204 may have the same threshold voltages $V_r$.

The gate of the transistor 1202 is coupled to the bootstrapping circuit which enables the transistor 1202 to fully or substantially pass the entire negative voltage signal at its input to its output. For one embodiment, the bootstrapping circuit may include the transistors 1203 and 1204, and the capacitors 1205 and 1206. The capacitors 1205 and 1206 receive non-overlapping clock signals.

The clock 2 signal represents the input clock signal clock 2 and the clock 1 signal represents the input clock signal clock 1. The input clock signals clock 1 and clock 2 are referred to as non-overlapping low signals because both clock input signals are typically not at a logic low voltage level simultaneously. Although the two clock input signals clock 1 and clock 2 may not have overlapping low signals, they typically have over-lapping high signals. The time durations T1, T3, T5, T7, T9, and T11 illustrate when the input clock signals clock 1 and clock 2 have over-lapping high periods. It is important to note that the input clock signals clock 1 and clock 2 have over-lapping high periods to ensure that transistors 1203 and 1204 are not on at the same time.

The operation of the zero voltage drop switch 1201 operating in its steady state is described below. After the zero voltage drop switch 1201 reaches its steady state, the voltage at the input 1207 of the zero voltage drop switch 1201 may be substantially equivalent to the voltage at the output 1211 of the zero voltage drop switch 1201. In other words, the input voltage $V_{in}$ may be considered to be equal to the output voltage $V_{out}$. For one embodiment, $V_{in}$ may be a negative voltage signal such that the absolute value of $V_{reg}$ is less than the absolute value of $V_{in}$. For one embodiment, the input clock signals clock 1 and clock 2 have a logic high voltage level at $V_{reg}$ volts and a logic low voltage level referred to as 0 volts. Furthermore, the $V_{reg}$ voltage level must be greater than the absolute value of the threshold voltage $V_t$ of the p-channel MOS transistors 1202, 1203, and 1204.

Phase 1 and phase 2 of the two input clock signals may be determined by the phase of the input clock signal clock 1. When the input clock signal clock 1 is at $V_{reg}$, then the two input clock signals may be in phase 1. On the other hand, when the input clock signal clock 1 is at 0 volts, then the two input clock signals may be in phase 2. For example, the time durations T3, T4, and T5 represents the input clock signals in phase 2 and the time duration T6 represents the input clock signals in phase 1.

During phase 1 when the clock 1 signal is at $V_{reg}$, the voltage at the node 1209 is typically at $(V_{in}-V_{reg})$ and the voltage at the node 1208 is typically at $V_{in}$. Furthermore, during phase 1, the transistors 1204 and 1202 may be off and the transistor 1203 may be on. On the other hand, during phase 2 when the clock 1 signal is at 0 volts, the voltage at node 1209 is typically at $V_{in}$ and the voltage at the node 1208 is typically at $(V_{in}-V_{reg})$. Furthermore, during phase 2, the transistors 1204 and 1202 may be on and the transistor 1203 may be on.

By substantially reducing the voltage drop across the switch device that couples the negative charge pump to the output of the negative switch, the negative voltage signal generated by the negative charge pump may substantially pass the entire negative voltage signal to the output of the negative switch without changing the semiconductor process.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A negative switch circuit, comprising:
    a first voltage path coupled to an output of said negative switch circuit;
    a second voltage path coupled to said output of said negative switch circuit, said second voltage path includes at least one zero voltage drop switch, at least one of said zero voltage drop switches having a first switch device coupled to a bootstrapping circuit, said bootstrapping circuit including a first capacitive device and a second capacitive device wherein said bootstrapping device provides said second voltage path with a deselection current having a substantially zero current.

2. The negative switch circuit of claim 1, wherein said first switch device includes a first terminal coupled to said second capacitive device, a second terminal coupled to an input of said zero voltage drop switch circuit, and a third terminal coupled to an output of said zero voltage drop switch circuit, and wherein said bootstrapping circuit includes a second switch device having a first terminal coupled to said first capacitive device, a second terminal coupled to said input of said zero voltage drop switch circuit, and a third terminal coupled to said second capacitive device, and a third switch device having a first terminal coupled to said second capacitive device, a second terminal coupled to said input of said zero voltage drop switch circuit, and a third terminal coupled to said first capacitive device.

3. The negative switch circuit of claim 2, wherein said first switch device, said second switch device, and said third switch device are p-channel MOS transistors.

4. The negative switch circuit of claim 2, wherein said zero voltage drop switch circuit further includes a clock driver circuit coupled to said first capacitive device and said second capacitive device, said clock driver circuit provides a first non-overlapping clock signal to said first capacitive device and a second non-overlapping clock signal to said second capacitive device.

5. The negative switch circuit of claim 4, wherein said first non-overlapping clock signal and said second non-overlapping clock signal do not have overlapping logic low voltage levels.

6. A memory device, comprising:
    a memory array including at least one memory cell; and
    a decoding circuit coupled to said memory array, said decoding circuit including at least one negative switch circuit, at least one of said negative switch circuits includes at least one zero voltage drop switch circuit having a first switch device coupled to a bootstrapping circuit, said bootstrapping circuit including a first capacitive device and a second capacitive device wherein said bootstrapping device provides a deselection current having a substantially zero current.

7. The memory device of claim 6, wherein at least one of said memory cells is a flash EEPROM memory cell.

8. The memory device of claim 6, wherein said decoding circuit includes a row decoding circuit, a block decoding circuit, or a plane decoding circuit.

9. The memory device of claim 6, wherein said first switch is fabricated with a dual well process.

10. The memory device of claim 6, wherein at least one of said negative switch circuits includes a negative voltage path and a positive voltage path, said negative voltage path includes at least one of said zero voltage drop switch circuits, said negative voltage path provides a deselection current having substantially zero current.

11. The memory device of claim 6, wherein said first switch device includes a first terminal coupled to said second capacitive device, a second terminal coupled to an input of said zero voltage drop switch circuit, and a third terminal coupled to an output of said zero voltage drop switch circuit, and wherein said bootstrapping circuit includes a second switch device having a first terminal coupled to said first capacitive device, a second terminal coupled to said input of said zero voltage drop switch circuit, and a third terminal coupled to said second capacitive device, and a third switch device having a first terminal coupled to said second capacitive device, a second terminal coupled to said input of said zero voltage drop switch circuit, and a third terminal coupled to said first capacitive device.

12. The memory device of claim 11, wherein said first switch device, said second switch device, and said third switch device are p-channel MOS transistors.

13. The memory device of claim 11, wherein said zero voltage drop switch circuit further includes a clock driver circuit coupled to said first capacitive device and said second capacitive device, said clock driver circuit provides a first non-overlapping clock signal to said first capacitive device and a second non-overlapping clock signal to said second capacitive device.

14. The memory device of claim 13, wherein said first non-overlapping clock signal and said second non-overlapping clock signal do not have overlapping logic low voltage levels.

15. The memory device of claim 6, wherein at least one of said negative switch circuits includes a row negative switch, a block negative switch, or a plane negative switch.

16. The memory device of claim 6, wherein at least one of said zero voltage drop switch circuits includes a first zero voltage drop switch circuit and a second zero voltage drop switch circuit, said first zero voltage drop switch circuit has an input that receives a negative voltage signal from a negative charge pump, said first zero voltage drop switch circuit has an output coupled to an input of said second zero voltage drop switch circuit, said second zero voltage drop switch circuit has an output coupled to an output of said negative switch circuit.

17. A zero voltage drop switch circuit, comprising:

a first capacitive device configured to receive a first non-overlapping clock signal;

a second capacitive device configured to receive a second non-overlapping clock signal;

a first switch device having a first terminal coupled to said second capacitive device, a second terminal coupled to an input of said zero voltage drop switch circuit, and a third terminal coupled to an output of said zero voltage drop switch circuit;

a second switch device having a first terminal coupled to said first capacitive device, a second terminal coupled to said input of said zero voltage drop switch circuit, and a third terminal coupled to said second capacitive device; and a third switch device having a first terminal coupled to said second capacitive device, a second terminal coupled to said input of said zero voltage drop switch circuit, and a third terminal coupled to said first capacitive device.

18. The zero voltage drop switch circuit of claim 17 wherein said first switch device, said second switch device, and said third switch device are p-channel MOS transistors.

19. The zero voltage drop switch circuit of claim 17 further comprising a clock driver circuit coupled to said first capacitive device and said second capacitive device, said clock driver circuit provides a first non-overlapping clock signal to said first capacitive device and a second non-overlapping clock signal to said second capacitive device.

20. The zero voltage drop switch circuit of claim 17, wherein said first switch device is larger in size than said second switch device and said third switch device.

21. The zero voltage drop switch circuit of claim 17, wherein said first switch device, said second switch device, and said third switch device have substantially the same threshold voltages.

22. The zero voltage drop switch circuit of claim 18, wherein said first non-overlapping clock signal and said second non-overlapping clock signal do not have overlapping low logic levels.

23. A method for fully passing a first voltage level from an input to an output of a switch circuit, comprising the steps of:

(a) receiving a first non-overlapping low clock input signal having a logic high voltage level or a logic low voltage level, said logic high voltage level is greater than said first voltage level by at least a threshold voltage of said switch circuit;

(b) receiving a second non-overlapping low clock input signal having said logic high voltage level or said logic low voltage level;

(c) providing said first voltage level to a first node during a first phase of said first and said second non-overlapping low clock input signals;

(d) providing a second voltage level to a second node during said first phase, said second voltage level is substantially equivalent to a difference between said first voltage level and said logic low voltage level; and (e) outputting said first voltage level during said first phase.

24. The method of claim 23 further comprising the steps of:

(f) providing said second voltage level to said first node during a second phase of said first and said second non-overlapping low clock input signals;

(g) providing said first voltage level to said second node during said second phase; and (h) maintaining said first voltage level at said output of said switch circuit during said second phase.

25. The method of claim 23, wherein said first voltage level represents $V_{in}$, said logic high voltage level represents $V_{reg}$, and said logic low voltage level represents 0 volts.

26. The method of claim 23, further comprising prior to step (a), the step of:

(i) powering up said switch circuit into its steady state.

* * * * *